US012770677B2

(12) United States Patent
Fujimaki

(10) Patent No.: US 12,770,677 B2
(45) Date of Patent: Oct. 20, 2026

(54) SMOOTH RTT TRANSITION

(71) Applicant: Micron Technology, Inc., Boise, ID (US)

(72) Inventor: Ryo Fujimaki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 18/760,554

(22) Filed: Jul. 1, 2024

(65) Prior Publication Data

US 2025/0191647 A1 Jun. 12, 2025

Related U.S. Application Data

(60) Provisional application No. 63/609,083, filed on Dec. 12, 2023.

(51) Int. Cl.
*G11C 11/4096* (2006.01)
*G11C 11/4093* (2006.01)
*H03K 19/00* (2006.01)

(52) U.S. Cl.
CPC ...... *G11C 11/4096* (2013.01); *G11C 11/4093* (2013.01); *H03K 19/0005* (2013.01)

(58) Field of Classification Search
CPC ............ G11C 11/4096; G11C 11/4093; G11C 16/3418; G11C 16/26; G11C 7/02; H03K 19/0005
See application file for complete search history.

(56) References Cited

U.S. PATENT DOCUMENTS

2008/0303546 A1* 12/2008 Millar ...................... G11C 7/02 326/30
2016/0013954 A1* 1/2016 Shokrollahi ............ H04L 25/14 375/257
2020/0159683 A1* 5/2020 Durai ................... G11C 7/1066
2023/0025764 A1* 1/2023 Dimitriu ................. H03M 5/20
2024/0086347 A1* 3/2024 Mahmoodi ......... G06F 13/1694
2024/0251565 A1* 7/2024 Lesso ....................... G06N 3/02
2025/0024688 A1* 1/2025 Lesso ..................... G06N 3/048

* cited by examiner

*Primary Examiner* — Seokjin Kim
(74) *Attorney, Agent, or Firm* — Fletcher Yoder, P.C.

(57) ABSTRACT

Systems and methods are provided for performing "smooth RTT transitions" to avoid unintended fluctuations in termination resistance (RTT) values (e.g., unexpected values during skewing). RTT control signals (e.g., RTT_PARK, RTT_WR, RTT_NOM_WR, RTT_NOM_RD) are converted from binary codes to unary codes, and resistance drivers are enabled/disabled based on the unary codes to provide corresponding termination resistance of the RTT control signals. There is no unintended value that occurs during the transitioning of the termination resistance from one value to another value. Accordingly, noises on the transmission line (e.g., connecting the memory device to a host device) caused by unintended fluctuations are reduced/avoided.

20 Claims, 4 Drawing Sheets

SMOOTH RTT TRANSITION

CROSS-REFERENCE TO RELATED APPLICATIONS

This application claims priority to U.S. Provisional Application No. 63/609,083, filed Dec. 12, 2023, which is incorporated by reference herein in its entirety.

BACKGROUND OF THE INVENTION

Field of the Invention

The present disclosure relates generally to the field of semiconductor memory devices. More specifically, embodiments of the present disclosure relate to transitions of termination resistance (RTT) in a memory device.

Description of the Related Art

An impedance (ZQ) calibration signal may be used in a memory device to tune output drivers and on die termination (ODT) values by adjusting pull-up and pull-down resistors of the memory device across changes in process, voltage and temperature (PVT) values. The ODT may be dynamically changed by using an RTT control signal (e.g., RTT_WR). Separate RTTs may be allowed for various operations. For example, the RTT control signal may include RTT_WR, RTT_NOM_WR, RTT_NOM_RD, and RTT-PARK for WR, NT_WR, NT_RD, and other states, respectively. The RTT control signals may have different RTT values corresponding to different settings of driver circuits. Since the RTT changes in conjunction with the command input, transitions occur between the RTT_PARK and other RTTs (e.g., RTT_WR, RTT_NOM_WR, RTT_NOM_RD). However, unintended fluctuations (e.g., unexpected values during skewing) in RTT values may occur when transitioning from a value of RTT to another value of RTT, which may cause noise (e.g., on a transmission line connecting the memory device to a host device).

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously mentioned, unintended fluctuations (e.g., unexpected values during skewing) in RTT values that may occur during the transitioning from a value of RTT to another value of RTT may cause noise (e.g., on a transmission line connecting the memory device to a host device). Therefore, it is desirable to avoid unintended fluctuations in RTT values during the transitioning of the RTT values.

The current disclosure herein provides systems and methods to perform "smooth RTT transitions" to avoid unintended fluctuations in termination resistance (RTT) values (e.g., unexpected values during skewing). RTT control signals (e.g., RTT_PARK, RTT_WR, RTT_NOM_WR, RTT_NOM_RD) may be converted from binary codes to unary codes, and driver circuits may be enabled/disabled based on the unary codes to provide corresponding RTT values of the RTT control signals. There may be no unintended RTT value during the transition of the RTT from a first value to a second value. Accordingly, noises on the transmission line (e.g., connecting the memory device to a host device) caused by unintended fluctuations may be reduced/avoided.

Figure 1:
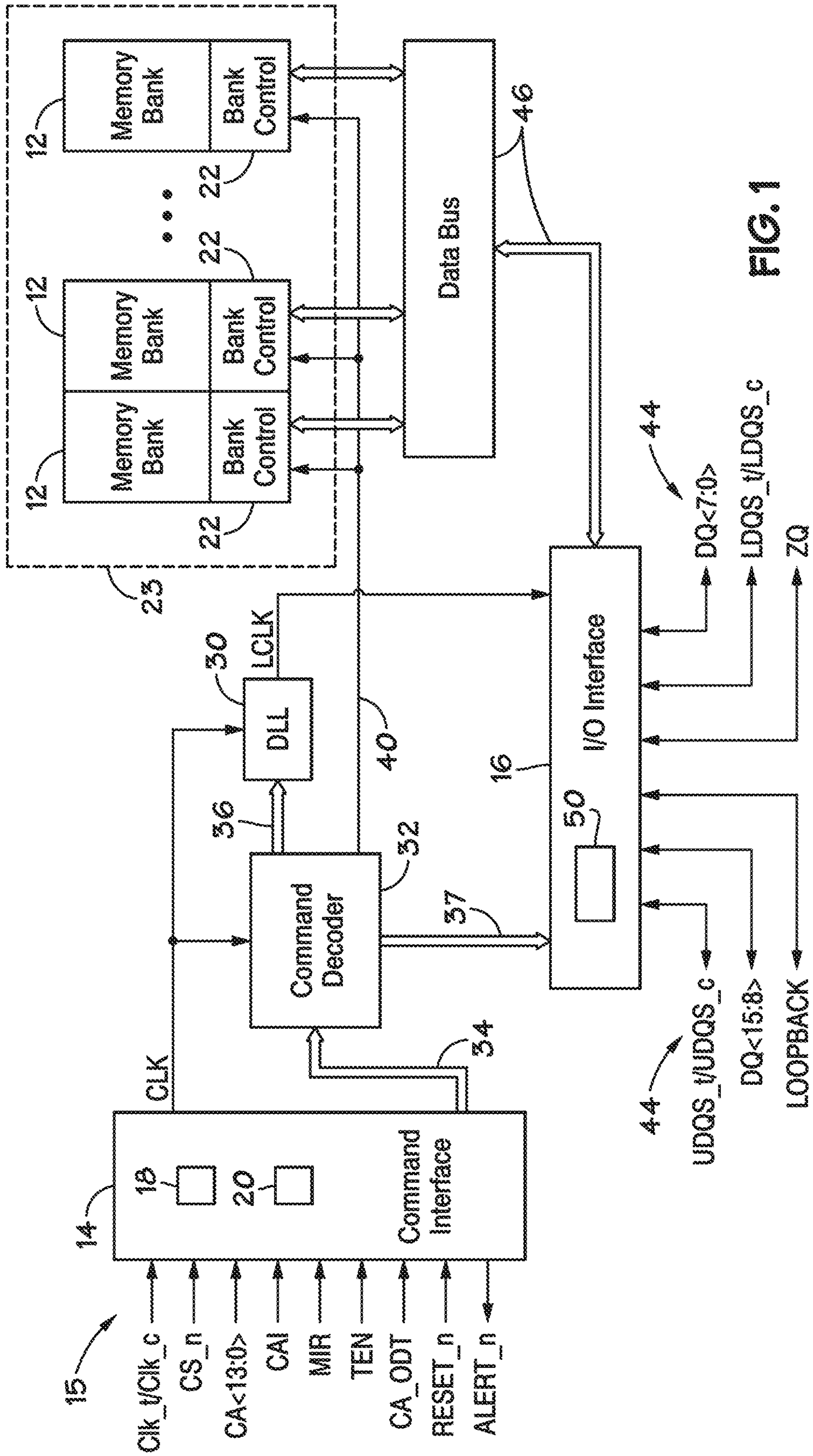
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12 arranged into 8 bank groups with each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command/address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from a command bus 34 and may decode the command signals to provide various internal commands. For instance, the command decoder 32 may provide command signals to the internal clock generator 30 over the bus 36 to coordinate generation of the phase controlled internal clock signal LCLK. The command decoder 32 may also provide command signals to the I/O interface 16 over a bus 37 to facilitate receiving and transmitting I/O signals. The phase controlled internal clock signal LCLK may be used to clock data through the I/O interface 16, for instance.

Further, the command decoder 32 may decode commands received from the command bus 34, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. A group of the memory banks 12 may be included in a memory chip 23, and the memory device 10 may include one or more memory chips.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command/address input circuit 20 in the command interface 14 may be configured to receive and transmit the commands to provide access to the memory banks 12, through the command decoder 32, for instance. In addition, the command interface 14 may receive a chip select signal (CS_n). The chip select signal CS_n enables the memory device 10 to process commands on the incoming command/address signals CA<13:0> for the memory chip selected by the chip select signal CS_n. Accordingly, access to specific banks 12 within the memory device 10 is facilitated by the information encoded on the chip select signal CS_n and the command/address signals CA<13:0>.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for an x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command)

or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and on die termination (ODT) values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the data I/O pins (DQ pins). The effective termination resistance (RTT) of the ODT may be adjusted by adjusting an output impedance of one or more driver circuits in an RTT control circuit 50, according to various embodiments of the present disclosure. The ODT may be dynamically changed by using an RTT control signal (e.g., RTT_WR). Separate RTTs may be allowed for various operations. For example, the RTT control signal may include RTT_WR, RTT_NOM_WR, RTT_NOM_RD, and RTT-PARK for WR, NT_WR, NT_RD, and other states, respectively. The RTT control signal may have different values corresponding to different settings of the driver circuits in the RTT control circuit 50, which may be defined by mode registers bits, as described in detail herein. Since the RTT changes in conjunction with the command input, transitions occur between the RTT_PARK and other RTTs (e.g., RTT_WR, RTT_NOM_WR, RTT_NOM_RD), and the transition timing is tADC. To reduce/avoid noise on the transmission line (e.g., connecting the memory device 10 to a host device) caused by unintended fluctuations (e.g., unexpected values during skewing) in RTT values that may occur when transitioning from a value of RTT to another value of RTT, it is desirable to have the RTT values constrained in a range between the beginning value and the end value of the transition during the transition, as described in detail herein.

In addition, a loopback signal (LOOPBACK) may be provided to the memory device 10 through the I/O interface 16. The loopback signal may be used during a test, debugging phase, or training phase to set the memory device 10 into a mode wherein signals are looped back through the memory device 10. For instance, the loopback signal may be used to set the memory device 10 to test the data input of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

As discussed above, unintended fluctuations in RTT may cause noise on the transmission line connecting the memory device 10 to the host device. Therefore, when transitioning from a value of RTT to another value of RTT, the RTT value during the transition may be constrained to a value between the beginning value and the end value of the transition to avoid unintended fluctuations in RTT values (e.g., unexpected values during skewing). The RTT control signals may have different values corresponding to different settings of the driver circuits in the RTT control circuit 50. An embodiment of the RTT control signals defined by mode register bits is illustrated in TABLE 1.

TABLE 1

| MR | 34 | Type | RTT_PARK & RTT_WR |
|---|---|---|---|
| 0 | RTT_PARK[1] | R | $000_B$ = RTT_OFF (Default), $001_B = R_{ZQ}$ (240Ω), $010_B = R_{ZQ}/2$ (120Ω), |
| 1 | | | $011_B = R_{ZQ}/3$ (80Ω), $100_B = R_{ZQ}/4$ (60Ω), $101_B = R_{ZQ}/5$ (48Ω), |
| 2 | | | $110_B = R_{ZQ}/6$ (40Ω), $111_B = R_{ZQ}/7$ (34Ω) |
| 3 | RTT_WR | R/W | $000_B$ = RTT_OFF, $001_B = R_{ZQ}$ (240Ω) (Default), $010_B = R_{ZQ}/2$ (120Ω), |
| 4 | | | $011_B = R_{ZQ}/3$ (80Ω), $100_B = R_{ZQ}/4$ (60Ω), $101_B = R_{ZQ}/5$ (48Ω), |
| 5 | | | $110_B = R_{ZQ}/6$ (40Ω), $111_B = R_{ZQ}/7$ (34Ω) |
| 6 | RFU | RFU | RFU |
| 7 | | | |

Notes:
[1]This mode register is programmed via an explicit MPC command only.

| MR | 35 | Type | RTT_NOM_WR & RTT_NOM_RD |
|---|---|---|---|
| 0 | RTT_NOM_WR | R/W | $000_B$ = RTT_OFF, $001_B = R_{ZQ}$ (240Ω), $010_B = R_{ZQ}/2$ (120Ω), |
| 1 | | | $011_B = R_{ZQ}/3$ (80Ω) (Default), $100_B = R_{ZQ}/4$ (60Ω), $101_B = R_{ZQ}/5$ |
| 2 | | | (48Ω), $110_B = R_{ZQ}/6$ (40Ω), $111_B = R_{ZQ}/7$ (34Ω) |
| 3 | RTT_NOM_RD | R/W | $000_B$ = RTT_OFF, $001_B = R_{ZQ}$ (240Ω), $010_B = R_{ZQ}/2$ (120Ω), |
| 4 | | | $011_B = R_{ZQ}/3$ (80Ω) (Default), $100_B = R_{ZQ}/4$ (60Ω), $101_B = R_{ZQ}/5$ |
| 5 | | | (48Ω), $110_B = R_{ZQ}/6$ (40Ω), $111_B = R_{ZQ}/7$ (34Ω) |
| 6 | RFU | RFU | RFU |
| 7 | | | |

Figure 2:
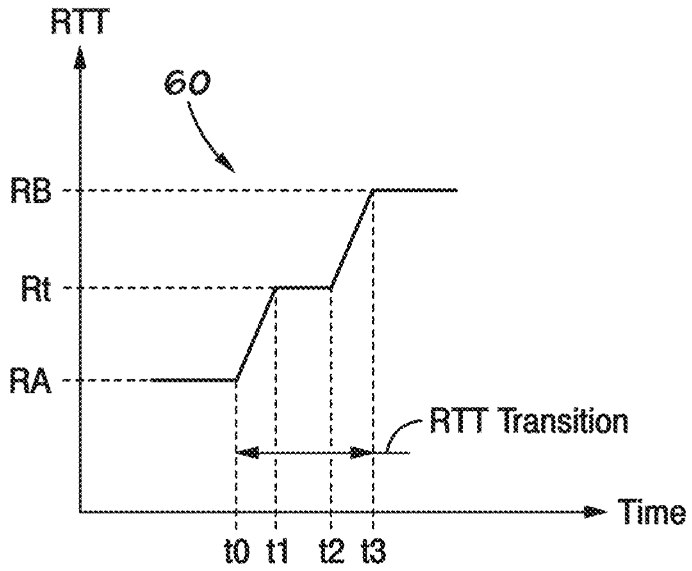
FIG. 2 is a plot showing a transitioning of an RTT, according to an embodiment of the present disclosure.

As shown in TABLE 1, values for each RTT control signal may be defined by three digits of a mode register (e.g., MR34, MR35) corresponding to eight values. For example, RTT_PARK is defined by MR34:OP [2:0], RTT_WR is defined by MR34:OP [5:3], RTT_NOM_WR is defined by MR35:OP [2:0], and RTT_NOM_RD is defined by MR35: OP [5:3]. Each RTT control signal may have eight RTT values corresponding to eight binary codes of the three corresponding digits. For example, when the binary code is 000, the corresponding RTT control signal is turned off; when the binary code is 001, the corresponding RTT value is 240 ohm (Ω); when the binary code is 010, the corresponding RTT value is 120Ω; when the binary code is 011, the corresponding RTT value is 80Ω; when the binary code is 100, the corresponding RTT value is 60Ω; when the binary code is 101, the corresponding RTT value is 48Ω; when the binary code is 110, the corresponding RTT value is 40Ω; when the binary code is 111, the corresponding RTT value is 34 (2. As mentioned previously, to reduce/avoid noise on the transmission line (e.g., connecting the memory device 10 to a host) caused by unintended fluctuations in RTT values (e.g., High impedance (HiZ)) that may occur when transitioning from a value of RTT to another value of RTT, the RTT during the transition may be constrained to a value between the beginning value and the end value of the transition, as illustrated in FIG. 2. For example, when transitioning the RTT from the value corresponding to the binary code 100 to the value corresponding to the binary code 001, the RTT value changes from 60Ω to 240Ω. The RTT value during the transition may be in the range of 60Ω to 240Ω (e.g., ≥60Ω and ≤240Ω) in order to reduce/avoid noise on the transmission line (e.g., connecting the memory device 10 to a host) caused by unintended fluctuations in RTT.

FIG. 2 is a plot showing an embodiment of an RTT transition 60 transitioning from a value of RA to a value of RB. For example, the transitioning may start at time t0, when the value of RTT is RA, and end at time t3, when the RTT value is RB. The time duration between t3 and t0 is the RTT transition time. In FIG. 2, Rt corresponds to the termination resistance during the transitioning from RA to RB, and it may have a value in the range of RA to RB (e.g., RA≤Rt≤RB). For example, during the transitioning from RA to RB, the RTT value may increase from RA to Rt during the time period of t0 to t1, and then increase from Rt to RB during the time period of t2 to t3. The above transitioning may be named "smooth RTT transition" since no unintended fluctuations of RTT values (e.g., Rt<RA or Rt>RB). Thus, during the RTT transition time of a "smooth RTT transition", RTT may not have a value that is less than RA or greater than RB. The RTT control circuit 50 may be designed to conduct the "smooth RTT transition", so that the RTT value during a transitioning may be constrained to a value between the beginning RTT value and the end RTT value of the transition.

Figure 3:
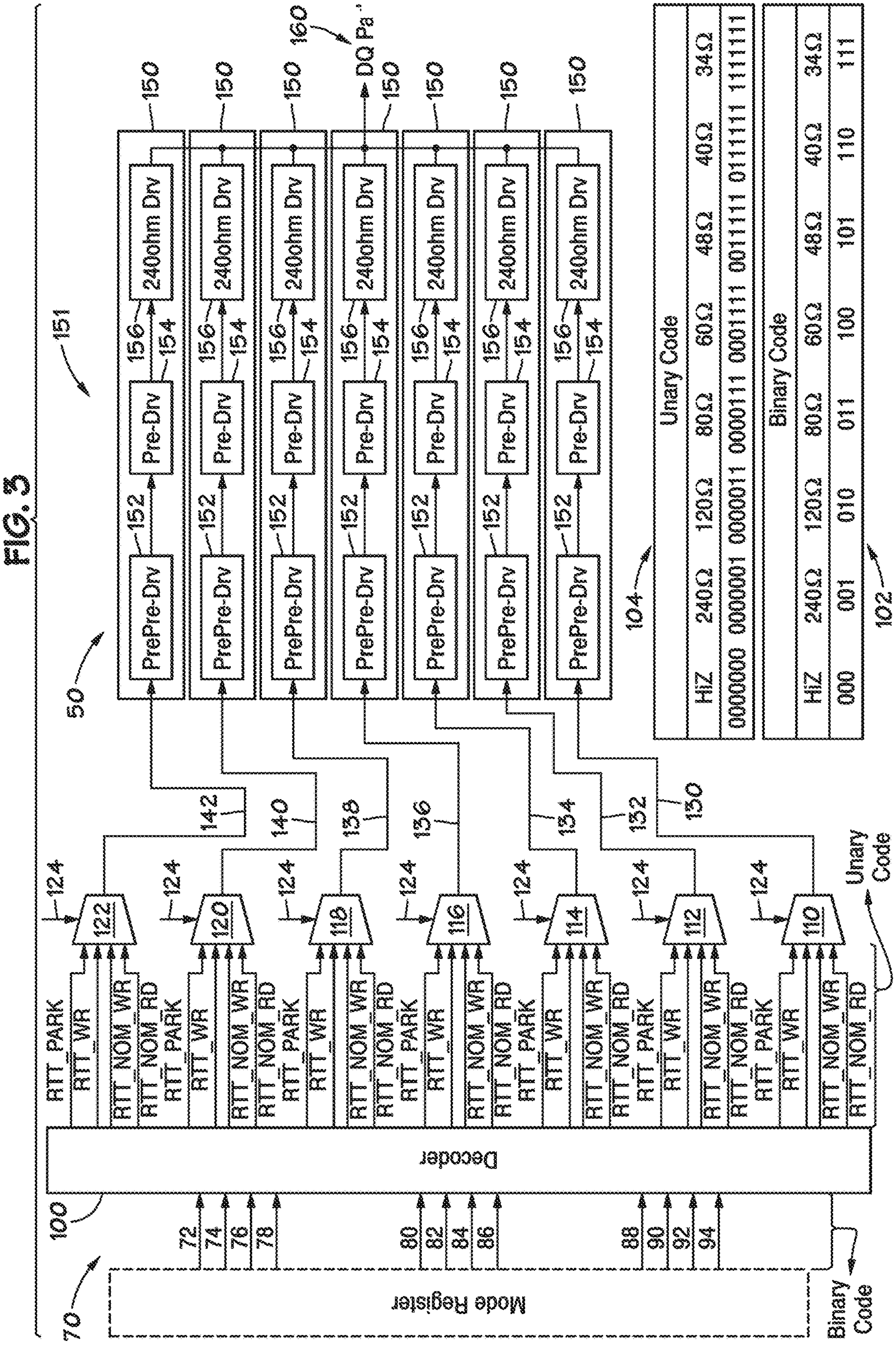
FIG. 3 illustrates a block diagram of an embodiment of a portion of an RTT control circuit of the memory device of FIG. 1, according to an embodiment of the present disclosure.

FIG. 3 illustrates an embodiment of a portion of the RTT control circuit 50 of the memory device 10 that may be used to perform "smooth RTT transitions." As illustrated, the RTT control circuit 50 may include a decoder 100 to receive mode register bits for RTT control signals from corresponding mode registers 70 (e.g., MR34, MR35). For example, a bit 72 may correspond to MR34 OP0, a bit 74 may correspond to MR34 OP3, a bit 76 may correspond to MR35 OP0, a bit 78 may correspond to MR35 OP3, a bit 80 may correspond to MR34 OP1, a bit 82 may correspond to MR34 OP4, a bit 84 may correspond to MR35 OP1, a bit 86 may correspond to MR35 OP4, a bit 88 may correspond to MR34 OP2, a bit 90 may correspond to MR34 OP5, a bit 92 may correspond to MR35 OP2, and a bit 94 may correspond to MR35 OP5. As discussed previously, values of the RTT control signals (e.g., RTT_PARK, RTT_WR, RTT_NOM_WR, RTT_NOM_RD) may be defined by binary codes of three corresponding mode register bits. For example, RTT_PARK is defined by MR34:OP [2:0], RTT_WR is defined by MR34:OP [5:3], RTT_NOM_WR is defined by MR35:OP [2:0], and RTT_NOM_RD is defined by MR35:OP [5:3]. Each RTT control signal may have eight values (e.g., HiZ, 240 Ω, 120 Ω, 80 Ω, 60 Ω, 48 Ω, 40 Ω, 34Ω) corresponding to eight binary codes of the three corresponding digits, as illustrated in a table 102. For example, when the binary code is 000, the corresponding RTT control signal is turned off (HiZ); when the binary code is 001, the corresponding RTT value is 240Ω; when the binary code is 010, the corresponding RTT value is 120Ω; when the binary code is 011, the corresponding RTT value is 80Ω; when the binary code is 100, the corresponding RTT value is 60Ω; when the binary code is 101, the corresponding RTT value is 48Ω; when the binary code is 110, the corresponding RTT value is 40Ω; when the binary code is 111, the corresponding RTT value is 34Ω.

The decoder 100 may be used to convert the three-digit binary codes to corresponding seven-digit unary codes to represent the eight values (e.g., HiZ, 240 Ω, 120 Ω, 80 Ω, 60 Ω, 48 Ω, 40 Ω, 34Ω) corresponding to the eight three-digit binary codes, as illustrated in a table 104. For example, when the three-digit binary code is 000, the corresponding seven-digit unary code is 00000000, and the corresponding RTT control signal is turned off (HiZ); when the three-digit binary code is 001, the corresponding seven-digit unary code is 0000001, and the corresponding RTT value is 240Ω; when the three-digit binary code is 010, the corresponding seven-digit unary code is 0000011, and the corresponding RTT value is 120Ω; when the three-digit binary code is 011, the corresponding seven-digit unary code is 0000111, and the corresponding RTT value is 80Ω; when the three-digit binary code is 100, the corresponding seven-digit unary code is 0001111, and the corresponding RTT value is 60Ω; when the three-digit binary code is 101, the corresponding seven-digit unary code is 0011111, and the corresponding RTT value is 48Ω; when the three-digit binary code is 110, the corresponding seven-digit unary code is 0111111, and the corresponding RTT value is 40Ω; when the three-digit binary code is 111, the corresponding seven-digit unary code is 1111111, and the corresponding RTT value is 34Ω.

The decoder 100 may output the seven-digit unary codes of each RTT control signal (e.g., RTT_PARK, RTT_WR, RTT_NOM_WR, RTT_NOM_RD) to selection devices (e.g., multiplexers) for selecting an RTT control signal. In some embodiments, each digit of the seven-digit unary codes may be transmitted to a respective selection device (e.g., a multiplexer), which may receive a selection signal to select an RTT control signal. For example, the first right digit of the seven-digit unary code may be transmitted to a selection device 110, the second right digit of the seven-digit unary code may be transmitted to a selection device 112, the third right digit of the seven-digit unary code may be transmitted to a selection device 114, the fourth right digit of the seven-digit unary code may be transmitted to a selection device 116, the fifth right digit of the seven-digit unary code may be transmitted to a selection device 118, the sixth right digit of the seven-digit unary code may be transmitted to a selection device 120, and the seventh right digit of the seven-digit unary code may be transmitted to a selection device 122. Each of the selection devices 110, 112, 114, 116, 118, 120, and 122 may receive selection signals 124 to select a respective digit for an RTT control signal (e.g., RTT_PARK, RTT_WR, RTT_NOM_WR, RTT_NOM_RD) and may transmit the selected digit through outputs 130, 132, 134, 136, 138, 140, and 142, respectively. The selection signals are generated from WR, WR_NT and RD_NT commands. Each output of the selection devices 110, 112, 114, 116, 118, 120, and 122 may be used to enable (e.g., when having a value of "1") or disable (e.g., when having a value of "0") a respective driver unit 150 of an output driver 151. Each driver unit 150 may include a pre-pre-driver 152 to drive a pre-driver 154, which may be used to drive a resistance driver 156 to obtain a resistance (e.g., 240Ω).

In some embodiments, the resistance driver 156 may have a drivability of 240Ω, and the driver units 150 of the output driver 151 may be electrically coupled in parallel to obtain a termination resistance (RTT). The output driver 151 may be electrically coupled to a DQ pad (e.g., data I/O pins) 160. Accordingly, when no driver unit 150 is enabled (e.g., corresponding to a unary code 0000000), the RTT may have a HiZ state (RTT off); when only one driver unit 150 is enabled (e.g., corresponding to a unary code 0000001), the RTT may have a resistance of 240Ω; when only two driver units 150 are enabled (e.g., corresponding to a unary code 0000011), the RTT may have a resistance of 120Ω (240 Ω/2); when only three driver units 150 are enabled (e.g., corresponding to a unary code 0000111), the RTT may have a resistance of 80Ω (240 Ω/3); when only four driver units 150 are enabled (e.g., corresponding to a unary code 0001111), the RTT may have a resistance of 60Ω (240 Ω/4); when only five driver units 150 are enabled (e.g., corresponding to a unary code 0011111), the RTT may have a resistance of 48Ω (240 Ω/5); when only six driver units 150 are enabled (e.g., corresponding to a unary code 0111111), the RTT may have a resistance of 40Ω (240 Ω/6); and, when all seven driver units 150 are enabled (e.g., corresponding to a unary code 1111111), the RTT may have a resistance of 34Ω (240 Ω/7). Accordingly, the RTT may have 8 values corresponding to the eight unary codes in the table 104. Since each unary code represent the number of resistance drivers 156 enabled, a transition from one value to another value of the RTT may involve enabling/disabling a certain number (e.g., 1 2, 3, 4, 5, 6, 7) of the resistance drivers 156. Moreover, during the transitioning from one RTT value to another RTT value, the certain number of resistance drivers 156 are either all enabled or all disabled resulting the RTT may only have resistance values between the beginning value and the end value of the transition. Thus, no unintended value may occur in the RTT value during the transitioning from one value to another value, and the transitions of the RTT between values may be "smooth RTT transitions".

Figure 4:
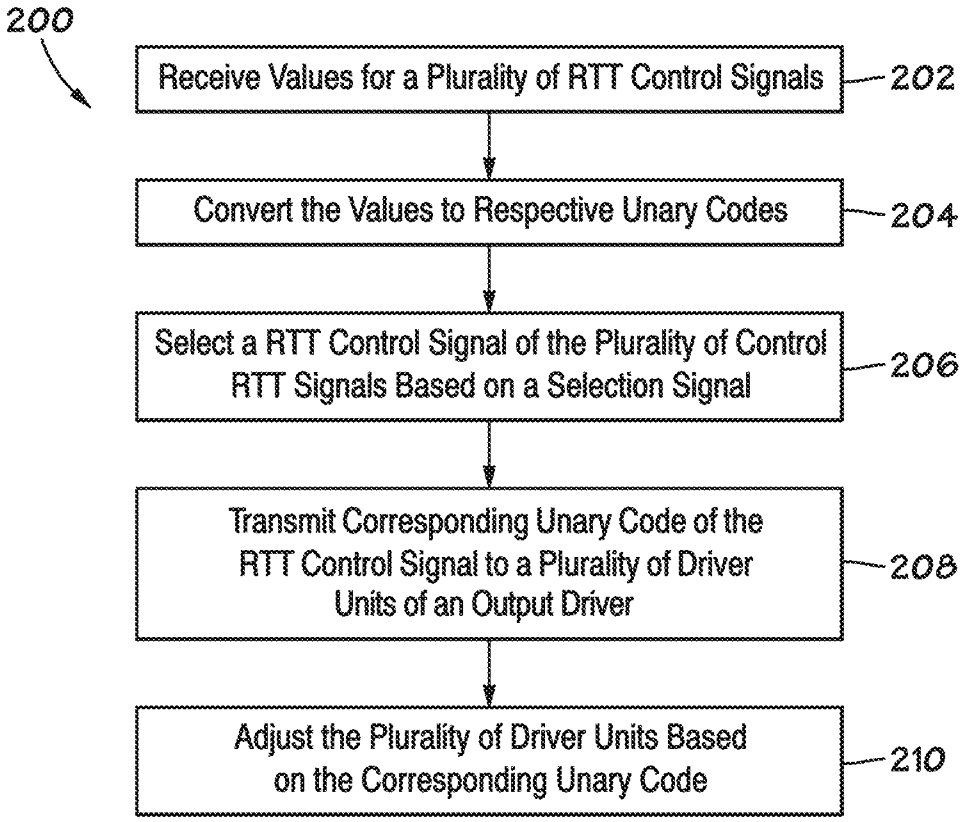
FIG. 4 is a flow diagram of a method for implementing the RTT control circuit of FIG. 3 to obtain an RTT value, according to an embodiment of the present disclosure.

FIG. 4 shows a flow diagram of a method 200 for implementing the RTT control circuit 50 to provide an RTT value based on an RTT control signal. At block 202, the RTT control circuit 50 may receive a plurality of RTT control signals (e.g., RTT_PARK, RTT_WR, RTT_NOM_WR, RTT_NOM_RD), whose values may be stored in one or more mode registers (e.g. MR34, MR35). At block 204, the RTT control signals may be converted to unary codes by the decoder 100. At block 206, an RTT control signal may be selected by the selection devices (e.g., selection devices 110, 112, 114, 116, 118, 120, and 122) based on the selection signal 124. At block 208, the corresponding unary code of the selected RTT control signal may be transmitted (e.g., via outputs 130, 132, 134, 136, 138, 140, and 142) to a plurality of driver units 150 of the output driver 151. At block 210, one or more driver units 150 may be enabled/disabled based on the corresponding unary code to obtain the RTT value corresponding to the unary code of the selected RTT control signal. Although the above description of the method 200 is described as being performed in a particular order, it should be understood that the method 200 may be performed in any suitable order.

Accordingly, the technical effects of the present disclosure include methods and systems for performing "smooth RTT transitions" to avoid unintended fluctuations in RTT values (e.g., unexpected values during skewing). Although seven selection devices are used in the embodiment illustrated in FIG. 3, other number of selection devices may be used in other embodiments. In addition, in the embodiment illustrated in FIG. 3, values of all RTT control signals (e.g., RTT_PARK, RTT_WR, RTT_NOM_WR, RTT_NOM_RD) may be first converted from binary codes to unary codes and then an RTT control signal may be selected. In some embodiments, an RTT control signal may be selected first (e.g., by selection devices), and the corresponding value of the selected RTT control signal may be converted from binary code to unary code. The embodiment illustrated in FIG. 3 may be beneficial for controlling the tADC timing since all the RTT control signals are prepared (e.g., converted from binary codes to unary codes) when receiving the selection signal 124.

It should be understood that logically-equivalent circuitry may be used to implement the systems and methods described above. For example, a logical XOR gate may be replaced via a logically-equivalent combination of NOT gates, AND gates, Inverse NOT gates, OR gates, NAND gates, NOR gates, or the like.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

What is claimed is:

1. An apparatus, comprising:
an I/O pin coupled to an output driver of which a termination resistance is adjustable; and
a termination resistance control circuit configured to transit the termination resistance from a first value to a second value, wherein the termination resistance control circuit comprises:
one or more selection devices configured to select a control signal of a plurality of control signals and output a unary code of the control signal, wherein the control signal corresponds to the second value.

2. The apparatus of claim 1, wherein the control signal comprises at least one of RTT_PARK, RTT_WR, RTT_NOM_WR, or RTT_NOM_RD.

3. The apparatus of claim 1, wherein the termination resistance is configured to have predefined values during a transition from the first value to the second value.

4. The apparatus of claim 1, wherein the control signal is converted to the unary code from a binary code.

5. The apparatus of claim 4, wherein the binary code of the control signal is stored in a mode register.

6. The apparatus of claim 1, wherein the termination resistance control circuit comprises a decoder configured to convert the second value to the unary code.

7. The apparatus of claim 1, wherein the output driver comprises a plurality of driver units coupled in parallel, and wherein the termination resistance is adjusted by enabling or disabling one or more driver units of the plurality of driver units.

8. The apparatus of claim 1, wherein the control signal is selected by the one or more selection devices from the plurality of control signals based on a selection signal.

9. A method, comprising:
receiving a plurality of control signals;
converting the plurality of control signals to respective unary codes;
selecting a control signal from the plurality of control signals and outputting a unary code of the control signal by using a plurality of selection devices, wherein the control signal corresponds to a termination resistance value; and
adjusting one or more driver circuits based on the unary code to generate the termination resistance value, wherein the one or more driver circuits are connected to an I/O pin of an apparatus.

10. The method of claim 9, wherein the control signal is a binary code.

11. The method of claim 10, wherein the binary code is stored in a mode register.

12. The method of claim 9, comprising:
selecting the control signal from the plurality of control signals based on a selection signal.

13. The method of claim 9, wherein the control signal comprises at least one of RTT_PARK, RTT_WR, RTT_NOM_WR, or RTT_NOM_RD.

14. The method of claim 13, wherein the termination resistance value is in a predefined range.

15. The method of claim 9, wherein the one or more driver circuits are coupled in parallel.

16. A termination resistance control circuit, comprising:
a decoder configured to receive a plurality of control signals and convert the plurality of control signals to respective unary codes;
a plurality of selection devices configured to select a particular control signal of the plurality of control signals based on a selection signal and output a unary code of the particular control signal, wherein the particular control signal corresponds to a particular termination resistance value; and
an output driver of which a termination resistance is adjustable, wherein the output driver is configured to provide the particular termination resistance value based on the unary code.

17. The termination resistance control circuit of claim 16, wherein the decoder is configured to convert the plurality of control signals from respective binary codes to the respective unary codes.

18. The termination resistance control circuit of claim 16, wherein the output driver comprises one or more driver units that are enabled or disabled based on the unary code.

19. The termination resistance control circuit of claim 16, wherein the particular termination resistance value is in a predefined range.

20. The termination resistance control circuit of claim 16, wherein the plurality of control signals comprise at least one of RTT_PARK, RTT_WR, RTT_NOM_WR, or RTT_NOM_RD.

* * * * *